(12) United States Patent
Birru

(10) Patent No.: US 6,856,649 B2
(45) Date of Patent: Feb. 15, 2005

(54) INITIALIZATION SCHEME FOR A HYBRID FREQUENCY-TIME DOMAIN EQUALIZER

(75) Inventor: Dagnachew Birru, Yorktown Heights, NY (US)

(73) Assignee: Koninklijke Philips Electronics N.V., Eindhoven (NL)

(*) Notice: Subject to any disclaimer, the term of this patent is extended or adjusted under 35 U.S.C. 154(b) by 703 days.

(21) Appl. No.: 09/822,454

(22) Filed: Mar. 30, 2001

(65) Prior Publication Data

US 2002/0168002 A1 Nov. 14, 2002

(51) Int. Cl.[7] .......................... H03K 5/159; H04B 1/10; G06F 17/10
(52) U.S. Cl. .................. 375/233; 375/350; 708/323
(58) Field of Search ................ 375/233, 250, 375/350; 333/165; 708/323

(56) References Cited

U.S. PATENT DOCUMENTS

| | | | | |
|---|---|---|---|---|
| 4,789,994 A | * | 12/1988 | Randall et al. | 375/233 |
| 5,293,401 A | * | 3/1994 | Serfaty | 375/231 |
| 5,502,747 A | * | 3/1996 | McGrath | 375/350 |
| 5,513,215 A | * | 4/1996 | Marchetto et al. | 375/233 |
| 5,692,011 A | * | 11/1997 | Nobakht et al. | 375/233 |
| 6,693,984 B1 | * | 2/2004 | Andre | 375/350 |
| 2003/0007554 A1 | * | 1/2003 | Birru | 375/233 |

FOREIGN PATENT DOCUMENTS

EP 1 043 875 A2 * 10/2000 ........... H04L/27/26

OTHER PUBLICATIONS

Proakis, Ph.D., J.G., Digital Communications, Third Edition, Section 11–2 Adaptive Decision–Feedback Equalizer, pp. 649–650 (1995).

* cited by examiner

*Primary Examiner*—Amanda Le
*Assistant Examiner*—Lawrence B. Williams

(57) ABSTRACT

This invention provides a method for initializing the filter coefficients of a hybrid frequency-time domain adaptive equalizer device implementing frequency domain (FD) filter equalization in a forward path and a time domain (TD) filter equalization in a feedback path, with each filter unit having a plurality of adaptable filter taps. Preferably, in initializing the equalizer, the relation $$\frac{1+F}{G} = H$$

is obeyed "where (G) is the forward FD equalizer taps, (F) is" the Fast Fourier Transform of the feedback TD equalizer taps, and (H) is the estimated (frequency domain) response of the communications channel.

14 Claims, 2 Drawing Sheets

INITIALIZATION SCHEME FOR A HYBRID FREQUENCY-TIME DOMAIN EQUALIZER

CROSS-REFERENCE TO RELATED APPLICATIONS

This application is related to commonly-owned, co-pending U.S. patent application Ser. No. 09/840,203, which is entitled "A HYBRID FREQUENCY-TIME DOMAIN EQUALIZER", filed on Apr. 23, 2001, and incorporated herein by reference in its entirety.

BACKGROUND OF THE INVENTION

1. Field of the Invention

This invention relates generally to digital signal processing systems implementing adaptive feedback equalization, and particularly, to an initialization scheme for a hybrid type equalizer having a frequency domain equalizer in the forward path and a time-domain equalizer in the feedback path.

2. Discussion of the Prior Art

Decision Feedback Equalization is a technique used to eliminate all inter-symbol interference (ISI) caused by the transmission channel in digital communication systems. FIG. 1 is a schematic illustration of a typical Decision Feedback Equalizer (DFE) system 10. As shown in FIG. 1, the typical DFE includes a feed forward path including a first finite impulse response (FIR) filter 12, a feedback path 13 including a second FIR filter 14, a decision device 15, and, an error calculator 18. The input symbol $x_n$ represents the symbol inputs which are input to the first finite impulse response (FIR) filter 12. It is understood that first and second FIR filters 12, 14 are linear transversal filters each representing an adaptive transfer function f(n), g(n), respectively according to respective sets of adaptable coefficients $f_n$, $g_n$. In operation, the output of the fist FIR filter 12 is summed with the output of the feedback FIR filter 14 section to provide a desired DFE output represented as signal $v_n$ 20. In operation, the coefficients of each of the forward FIR filter 12 and feedback FIR filter 14 recursively adapt according an output error signal $e_n$ 16 of the feedback path until some convergence factor or error metric, e.g., mean square error, is satisfied. As shown in FIG. 1, the output error signal $e_n$ 16 of the feedback path represents the difference between an input reference signal 21, i.e. a desired output signal, and an intermediate output signal $y_n$ which is an output of decision block 15. As known to skilled artisans and described in "Adaptive Decision-Feedback Equalizer" in the book "Digital Communications" by John G. Proakis, McGraw-Hill, 1995, 3rd ed., Ch. 11-2. pages 650 et seq., (ISBN 0-07-05-51726-6), the whole contents and disclosure of which is incorporated by reference as is fully set forth herein, the equalizer coefficients are adjusted recursively in the adaptive mode of the DFE.

In such decision feedback equalizers, schemes are implemented that require a fairly good initial setup of equalizer taps (coefficients) to ensure that most of the (tentatively) decoded symbols are correct. Blind equalization algorithms permit estimation of the equalizer coefficients without any knowledge about the channel response or the data sent.

It would be highly desirable to provide an initialization scheme for a decision feedback equalizer of a special type herein referred to as a hybrid equalizer having a frequency domain equalizer in the forward path and a time-domain equalizer in the feedback path.

SUMMARY OF THE INVENTION

It is thus an object of the present invention to provide a methodology for initializing filter tap coefficients in a hybrid equalizer device having a frequency domain equalizer in the forward path and a time-domain equalizer in the feedback path.

In accordance with the preferred embodiment of the invention, there is provided a method for initializing filter coefficients for a hybrid feedback equalizer device for reducing interference of signals transmitted over a communications channel, the hybrid feedback equalizer device implementing frequency domain (FD) filter equalization in a forward path and a time domain (TD) filter equalization in a feedback path, each filter unit having a plurality of adaptable filter taps, wherein the method comprises the steps of: disabling the feedback TD equalizer filter; generating an estimated frequency response transfer function (H) of said channel; obtaining time domain representation of equalizer taps in the forward FD equalizer and eliminating taps corresponding to occurrence of post-echoes present in the channel estimate H; generating a frequency domain representation G of equalizer taps in the forward FD equalizer filter; generating a frequency-domain representation F of the equalizer taps in the feedback TD equalizer filter; performing an inverse Fast Fourier Transform (IFFT) on the frequency-domain representation F to yield the time-domain feedback equalizer taps, wherein the obtained taps F and G are used to initialize the feedback TD filter coefficients and forward FD filter coefficients of the hybrid equalizer, respectively.

Preferably, in initializing the equalizer, the relation $$\frac{1+F}{G} = H$$

is obeyed where G is the forward FD equalizer taps, F is the FFT of the feedback TD equalizer taps, and H is the channel estimate (frequency domain).

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS

Figure 2:
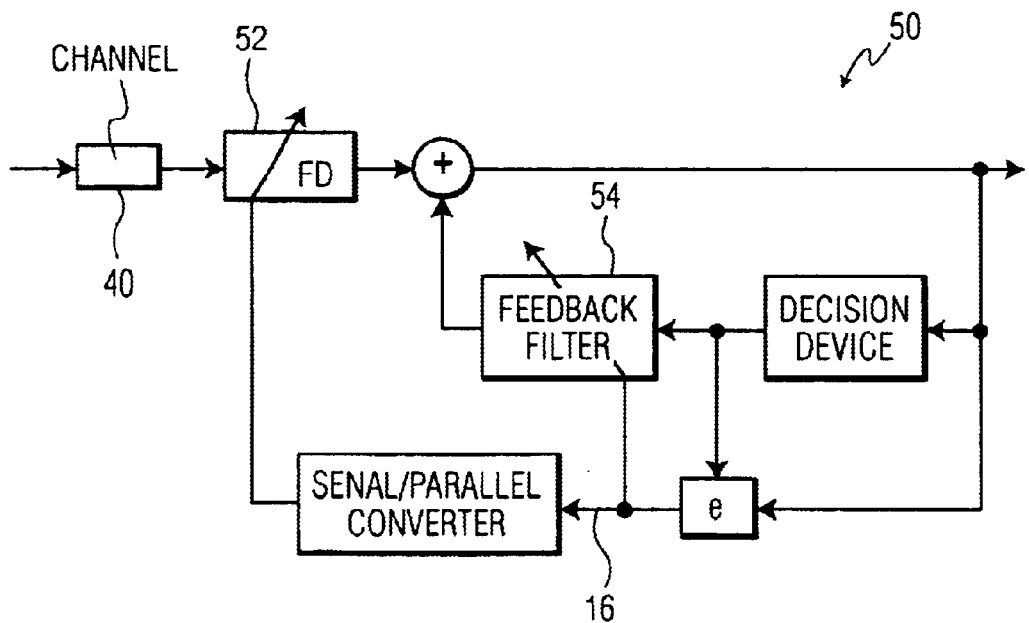
FIG. 2 is a simplified block diagram of a hybrid Frequency-Time Domain Equalizer to which the initialization scheme of the present invention is incorporated.

FIG. 2 is a simplified block diagram of a hybrid Frequency-Time Domain Equalizer 50 to which the initialization scheme of the present invention is incorporated. As described in greater detail in commonly-owned, co-pending U.S. patent application Ser. No. 09/840,203, which is entitled "A HYBRID FREQUENCY-TIME DOMAIN EQUALIZER" herein incorporated, the Decision Feedback Equalizer is a hybrid type equalizer having a frequency domain (FD) equalizer 52 in the forward path and a time-domain (TD) equalizer 54 in the feedback path. The present invention is directed to a scheme for initializing the filter tap coefficients in both the FD and TD paths.

Figure 1:
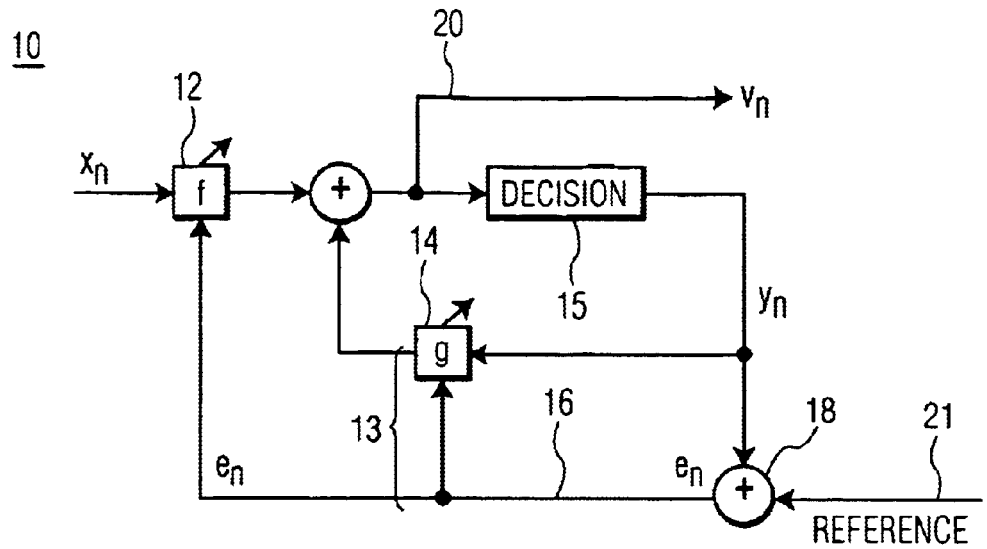
FIG. 1 is a block schematic diagram depicting a conventional Decision Feedback Equalizer.

As described in greater detail in commonly-owned, co-pending U.S. patent application Ser. No. 09/840,203, the main difference between a standard DFE of FIG. 1 and this hybrid FD-TD equalizer is in the use of the frequency domain equalizer in its forward path. While both the forward frequency domain (FD) equalizer and time-domain (TD) feedback equalizer are adapted using the same error vector 16, the update of the FD portion is performed in the frequency domain, while the update of the feedback TD filter coefficients is done in the conventional sample-by-sample time-domain update. The error vector may be computed using blind decision-directed algorithm Constant Modulus Algorithm (CMA) as known to those skilled in the art. The choice of a hybrid equalizer is preferable as initial convergence speed and tracking is enhanced by adapting the taps (the frequency bins) individually.

According to the preferred embodiment of the invention, the length of the forward FD equalizer 52 is long, permitting the calculation of an inverse channel estimate, frequency response, for channel 40. That is, an inverse channel estimate is first made using blind adaptive algorithms and the FD equalizer while the TD equalizer is disabled. Once the inverse channel estimate is obtained, the total equalizer is initialized. The process steps involved in this initialization scheme of the invention is now described with respect to FIG. 4.

Figure 4:
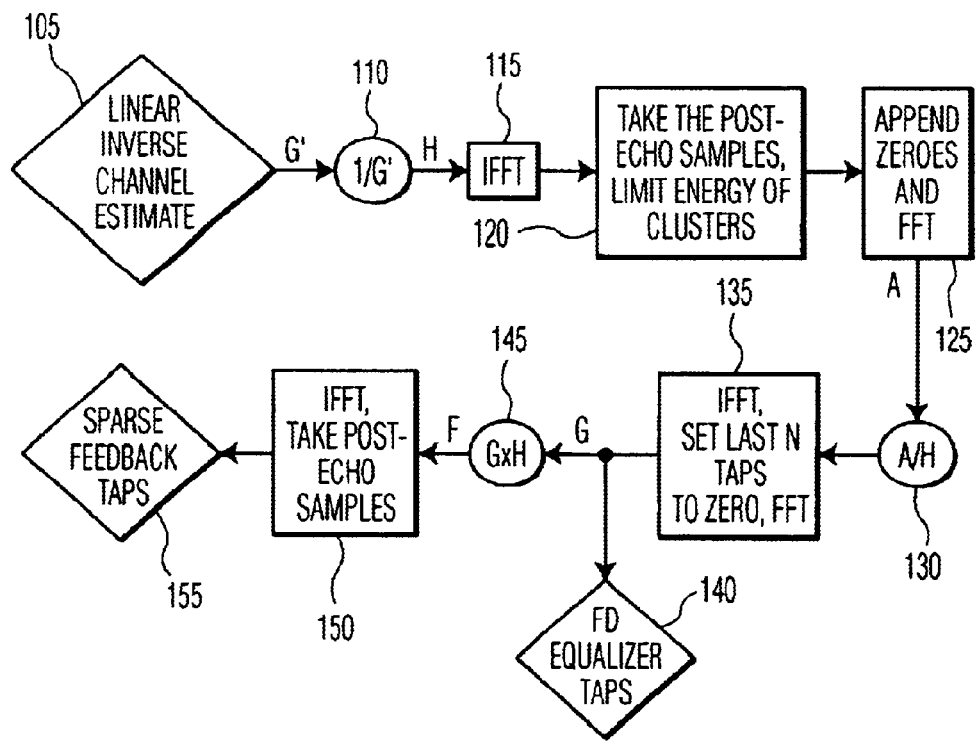
FIG. 4 is a flow chart depicting the steps involved in the initialization scheme of the invention.

As shown in FIG. 4, a first step 105 of the initialization scheme 100 of the invention is to disable the TD filter 54 and obtain a linear inverse channel estimate, G', by running the FD equalizer using blind adaptive algorithms. Well known techniques such as described in the book "Digital Communications" by John G. Proakis, McGraw-Hill, 1995, 3rd ed., Chapters 10 and 11, (ISBN 0-07-05-51726-6), may be implemented for calculating the linear inverse channel estimate. For example, in automatic synthesis, a received training signal as long as the filter tap length, may be converted to a spectral representation. A spectral inverse response may then be calculated to compensate for the channel response. For a good channel estimate, the Fast Fourier Transform (FFT) size (FD filter) must be large, e.g., a 2K FFT (2048-point FFT), however may range anywhere between 1K FFT and 4K FFT. Next, at step 110, the inverse channel estimate is inverted to generate the channel estimate (channel response), H, and, at step 115, an inverse FFT (IFFT) operation is performed on H to result in a time domain profile of the channel.

Figure 3:
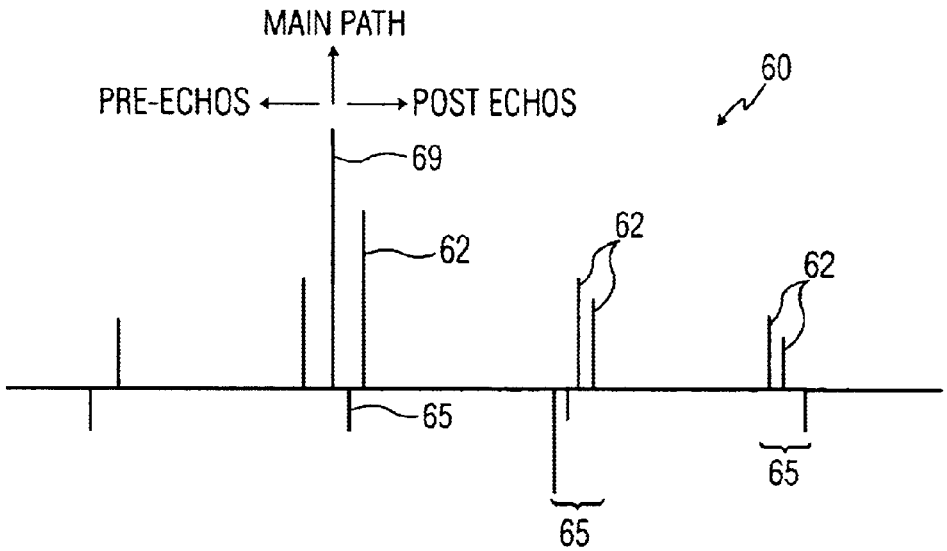
FIG. 3 is an example multipath pattern showing presence of post-echoes (ISI) in a communications channel.

In general, it is typically the case that post echoes exhibited in a typical multipath pattern correspond to taps of the feedback (TD) equalizer. An example time domain profile of the channel response is shown in FIG. 3 which illustrates an example multipath pattern 60 including presence of post-echoes 62 which are grouped into clusters 65 that occur after the strongest echo 69 or main path signal and represent undesirable ISI (interference). Each cluster group 65 particularly comprises energy that is calculated by summing the square of each echo in the group (cluster). Thus, at step 120 these post echoes are extracted and their energy limited to certain values, e.g., by limiting the sum of the square of the taps in the cluster be less than a certain constant. The resulting post-echo profile is appended with zeroes and an FFT operation is performed on the resulting sequence as indicated at step 125 to obtain a frequency domain representation (A) of the post-echo profile. Then, as indicated at step 130, the resulting frequency-domain information A is divided by the channel estimate H, i.e., a point-wise division of the vectors A and H is performed. An inverse Fast Fourier Transform of A/H is then performed at step 135 to obtain a time domain representation of the FD equalizer and, the last N taps are set to zero. Additionally, after setting the last N taps to zero, a FFT of the resulting time domain representation of FD equalizer is performed to obtain the frequency domain representation G of the FD equalizer taps at step 140. Preferably, the last N taps are set to zero so as to prevent them from appearing in G. It should be understood that N is implementation dependent. According to the invention, it is these taps that are used to initialize the forward filter (FD equalizer). The FD equalizer taps G (forward path) are then multiplied by the channel estimate H to yield as indicated at step 145, and, an inverse FFT is performed on this data to yield the time-domain feedback equalizer taps (F) for the hybrid equalizer (feedback path) as indicated at step 155. Preferably, the post echo samples are taken out after the main path.time-domain feedback equalizer taps for the hybrid equalizer (feedback path), as indicated at step 150. It should be understood that in all these steps, the governing relationship used to find the equalizer taps from the channel estimate is the ideal minimum mean square solution of the equalizer. This solution provides the following relationship that must be obeyed in initializing the equalizer, where G is the forward FD equalizer taps, F is the FFT of the feedback TD equalizer taps, and H is the channel estimate (frequency domain).

$$\frac{1+F}{G} = H$$

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

I claim:

1. A method for initializing filter coefficients for a hybrid feedback equalizer device for reducing interference of signals transmitted over a communications channel, said hybrid feedback equalizer device implementing frequency domain (FD) filter equalization in a forward path and a time domain (TD) filter equalization in a feedback path, each FD (forward path) and TD (feedback path) filter units having a plurality of adaptable filter taps, said method comprising:

a) generating an estimated frequency response transfer function (H) of said channel;
   b) performing an inverse Fast Fourier Transform (IFFT) on said channel transfer function (H) to result in a time domain profile of said channel;
   c) limiting energy of each occurrence of post-echoes present said channel to a predetermined value and generating a post-echo profile from said time domain profile;
   d) obtaining a frequency domain representation (A) of the post-echo profile, and
      dividing said frequency-domain representation (A) by "estimated frequency response transfer function (H)" to obtain (A)/(H);
   e) performing an IFFT of (A)/(H) to obtain a time domain representation of the FD equalizer taps and eliminating presence of a predetermined number of taps of said time domain representation of the FD equalizer; and, f) performing a FFT of the resulting time domain representation of FD equalizer to obtain frequency domain representation of FD equalizer taps (G), whereby said obtained taps are used to initialize the forward FD filter of said hybrid equalizer.

2. The method as claimed in claim 1, further including the steps of:
   a) multiplying said obtained FD equalizer taps (G) of step f) with the "estimated frequency response transfer function (H)" to generate a frequency-domain representation (F) of the feedback taps; and,
   b) performing an IFFT on the frequency-domain representation (F) to yield the time-domain feedback equalizer taps, wherein said obtained taps are used to initialize the feedback TD filter of said hybrid equalizer.

3. The method as claimed in claim 1, wherein said step a) comprises the steps of:
   generating a linear inverse frequency response estimate, (G') of said channel; and,
   inverting said linear inverse frequency response estimate to obtain said "estimated frequency response transfer function (H)".

4. The method as claimed in claim 3, wherein said step of generating a linear inverse frequency response estimate (G') comprises the steps of:
   disabling said feedback TD equalizer filter; and,
   utilizing a blind adaptive algorithm and implementing a Fast Fourier Transform (FFT) operation to said FD equalizer filter.

5. The method as claimed in claim 4, wherein said FFT ranges between a 1K FFT and a 4K FFT.

6. The method as claimed in claim 1, wherein said step c) further includes the steps of:
   extracting clusters of post echo samples relating to taps of said feedback TD filter and limiting energy of said clusters;
   appending zeros to said post-echo profile after cluster extraction.

7. The method as claimed in claim 1, wherein said step e) of eliminating presence of taps of said time domain representation of the FD equalizer includes setting the last N taps to zero.

8. The method as claimed in claim 1, wherein said post echoes are exhibited in a multipath interference signal pattern, each cluster group comprising energy calculated as the sum of the square of each echo in the group, said step of limiting the energy of said clusters including the step of: limiting a value of the sum of the square of the taps the cluster.

9. The method as claimed in claim 2, wherein initializing filter coefficients for said hybrid feedback equalizer device obeys the relation:

$$\frac{1+F}{G} = H.$$

10. A method for initializing filter coefficients for a hybrid feedback equalizer device for reducing interference of signals transmitted over a communications channel, said hybrid feedback equalizer device implementing frequency domain (FD) filter equalization in a forward path and a time domain (TD) filter equalization in a feedback path, each filter unit having a plurality of adaptable filter taps, said method comprising:

a) disabling said feedback TD equalizer filter;
b) generating an estimated frequency response transfer function (H) of said channel;
c) obtaining time domain representation of equalizer taps in said forward FD equalizer and eliminating taps corresponding to occurrence of post-echoes present in said "estimated frequency response transfer function (H)";
d) generating a frequency domain representation (G) of equalizer taps in said forward FD equalizer filter;
e) generating a frequency-domain representation (F) of the equalizer taps in said feedback TD equalizer filter; and,
f) performing an inverse Fast Fourier Transform (IFFT) on the frequency-domain representation (F) to yield the time-domain feedback equalizer taps, wherein said obtained taps are used to initialize the feedback TD filter coefficients and forward FD filter coefficients of said hybrid equalizer, respectively.

11. The method as claimed in claim 10, wherein initializing filter coefficients for said hybrid feedback equalizer device obeys the relation:

$$\frac{1+F}{G} = H.$$

12. The method as claimed in claim 11, wherein said step b) comprises the steps of:
   generating a linear inverse frequency response estimate, (G') of said channel; and,
   inverting said linear inverse frequency response estimate to obtain said "estimated frequency response transfer function (H)".

13. The method as claimed in claim 10, wherein said inverse FFT (IFFT) results in a time domain profile, said step d) of generating a frequency domain representation (G) of equalizer taps in said forward FD equalizer filter further comprising the steps of:
   limiting energy of each occurrence of post-echoes present in said channel to a predetermined value and generating a post-echo profile from said time domain profile;
   obtaining a frequency domain representation (A) of the post-echo profile, and
   dividing said frequency-domain information (A) by said "estimated frequency response transfer function (H) to obtain (A)/(H)";
   performing an IFFT of (A)/(H) to obtain a time domain representation of the FD equalizer taps, and eliminating presence of a predetermined number of taps of said time domain representation of the FD equalize; and,
   performing a FFT of the resulting time domain representation of FD equalizer to obtain said frequency domain representation of FD equalizer taps (G).

14. The method as claimed in claim 10, wherein said step e) of generating a frequency-domain representation (F) of the equalizer taps in said feedback TD equalizer filter further comprises the step of multiplying said obtained FD equalizer taps (G) with the "estimated frequency response transfer function (H)" to generate a frequency-domain representation (F) of the feedback tape.

* * * * *